United States Patent [19]

Sung-Mu

[11] Patent Number: 5,440,158
[45] Date of Patent: Aug. 8, 1995

[54] ELECTRICALLY PROGRAMMABLE MEMORY DEVICE WITH IMPROVED DUAL FLOATING GATES

[75] Inventor: Hsu Sung-Mu, I-Lan, Taiwan

[73] Assignee: Taiwan Semiconductor Manufacturing Company Ltd., Hsinchu, Taiwan

[21] Appl. No.: 270,737

[22] Filed: Jul. 5, 1994

[51] Int. Cl.⁶ .......................................... H01L 29/76
[52] U.S. Cl. .................................... 257/314; 257/315; 257/316; 365/185
[58] Field of Search .................. 365/185, 182, 900; 257/315, 314, 316, 317, 318, 319, 321, 900

[56] References Cited

U.S. PATENT DOCUMENTS 5,229,631  7/1993  Woo .................................. 257/314

Primary Examiner—David C. Nelms
Assistant Examiner—Tan Nguyen
Attorney, Agent, or Firm—George O. Saile

[57] ABSTRACT

An improved method and structure for producing electrically programmable read only memory devices (EPROM's) and flash EPROM's having dual sidewall floating gates is provided. A conformal polysilicon layer is formed over a masking line with vertical sidewalls. The conformal layer is anisotrophically etched to form dual floating gates on the sidewalls of the masking line. The masking lines is removed. Source and drain regions are formed in-between and on either side of the dual gates. An insulating layer is formed over the dual gates and substrate surface. A control gate is formed over the dual gates. Word lines and other electrical contracts are formed to complete the EPROM or flash EPROM device.

23 Claims, 4 Drawing Sheets

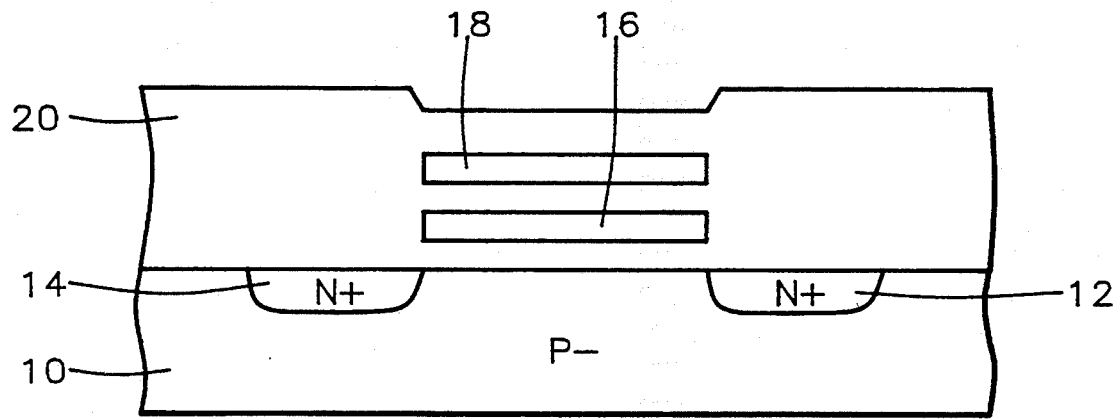
*FIG. 1 - Prior Art*
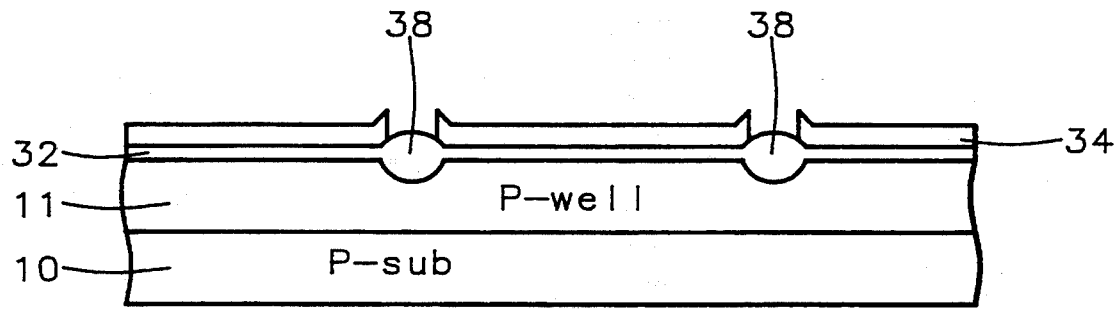
*FIG. 2A*
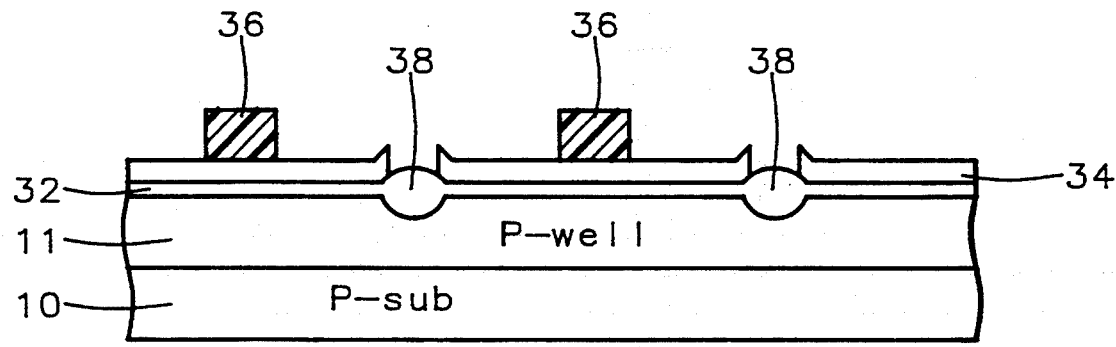
*FIG. 2B*

ELECTRICALLY PROGRAMMABLE MEMORY DEVICE WITH IMPROVED DUAL FLOATING GATES

BACKGROUND OF INVENTION

1) Field of the Invention

This invention relates to semiconductor devices and more particularly to an improved structure and method for producing electrically programmable read only memory devices (EPROM's) and flash EPROM's devices.

2) Description of the Prior Art

In the last decade, semiconductor memories have been the fastest growing segment of the semiconductor industry, with the large increase due to the rapid growth of digital electronics market with multiplying applications. Moreover, flash electrically programmable read only memories devices (flash EPROM's) are being produced in larger quantities. Lately, high density flash memory has been expected to replace some pan of the large computer external storage device market. One of the goals in the fabrication of flash electrically programmable read only memories (flash EPROM's) is the production of a memory circuit that is capable of storing a maximum amount of information using a minimum amount of semiconductor surface area. However, photolithographic limits imposed by conventional semiconductor processing technology impede the achievement of this goal. Thus, the inability to pattern and etch semiconductor features closed together prevents a memory cell from occupying a smaller portion of a semiconductor's surface. Another goal of flash EPROM manufacturing is use of a simple cheap high yielding process. Many previous methods to reduce device size add too much complexity and cost.

Flash EPROM's frequently use a floating gate avalanche injection metal oxide semiconductor (FAMOS) structure to store information. Floating gate dimensions in a FAMOS memory cell are conventionally established with reference to minimum photolithographic limits and therefore produce undesirable large memory cells. A conventional configuration for an EPROM device is the stacked gate structure as shown in FIG. 1. Source 12 and Drain 14 regions are formed in substrate 10. The floating gate 16 overlies the channel region, the area between the source and drain. The control gate 18 overlays the floating gate 16. An insulating structure 20 insulates the substrate, floating gate and control gate. The minimum size of the conventional stack gate structure is determined by the photolithographic limits which determine the floating gate, control gate, source and drain widths.

A less than optimal solution to this problem of sizing the floating gate at minimum photolithographic limits is provided by the use of a side wall floating gate formed on a sidewall of a control gate. However, since the floating gate is merely added to a sidewall of a photolithographic defined control gate, the resulting structure is actually larger than a structure achievable at minimum photolithographic limits. In addition, it provides an undesirable diminished capacitive coupling between the floating gate and the control gate. Accordingly, a need exists for a memory cell in which a floating gate structure is provided with dimension less than minimum photolithographic limits, but which is not formed on a sidewall of a control gate.

A method of producing an EPROM having sidewall floating gates that seeks to reduce cell size is shown in U.S. Pat. No. 5,143,860. Floating gates are formed on the sidewalls of oxide layers overlying the source and drain regions. A control gate layer overlies two adjacent floating gates. This method produces EPROM cells smaller than that achievable using conventional the photolithographic limited stacked gate structure. However, this cell has the limitation of a small control gate to floating gate contact area which reduces the capacitive coupling which in turn makes the floating gate less responsive to voltage charges from the control gate. More importantly, this method is not the optimal solution and a need for a smaller cell structure still exists.

SUMMARY OF THE INVENTION

A general object of the invention is to provide an improved structure for a flash electrically programmable read only memory device.

A more specific object of the present invention is to provide an improved structure of a flash electrically programmable read only memory device having a dual sidewall floating gate structure.

Yet another more specific object of the present invention is to provide an improved structure of an flash electrically programmable read only memory device having a dual sidewall floating gate structure which reduces the memory cell size, increases the capacitive coupling between the floating gate and the control gate, and reduces manufacturing costs.

In accordance with the above objects, a structure and a method for an improved flash EPROM is provided. A thin insulating layer and then an oxidation resistant masking layer, typically a nitride, are formed on the surface of a semiconductor substrate with a background doping of a first conductivity type. Openings are formed in the masking layer and thick field oxide is grown in the openings. Next, the nitride masking layer is patterned to form nitride lines with vertical sidewalls that will determine the locations of the source regions and the floating gates. Following this, a gate oxide layer and then a conformal polysilicon layer are formed on the substrate surface. The polysilicon layer is anisotropically, etched to form floating gates on the vertical sidewalls of the nitride lines.

Subsequently, the nitride lines are removed. The source and drain regions are formed by ion implantation through space between the field oxide and the floating gates. The photoresist layer is then removed. Now, the substrate is oxidized to thicken the thin insulating layers over the source and drain regions forming a thick insulating layer. A composite insulating layer is formed over portions of the field oxide, the drain, floating gate and source regions. Then, a conductive layer which acts as the control gate, is formed over the composite insulting layer.

Lastly, a dielectric layer is form over the substrate surface. Electrical contacts and metallurgical lines with appropriate passivation are formed that connect the source, drain and gate elements to form an electrically programmable memory device.

BRIEF DESCRIPTION OF THE DRAWINGS

The drawings show the following:

FIG. 1 is cross-sectional views in broken section in greatly enlarged scale that illustrate a stacked gate EPROM fabricated in accordance with the prior an processes FIGS. 2A, 2B through 9 are a sequence of cross-sectional views in broken section in greatly enlarged scale that illustrate a device structure including dual floating gates in various stages of fabrication in accordance with the process of the invention.

DETAILED DESCRIPTION OF THE PREFERRED EMBODIMENTS

Figure 3:
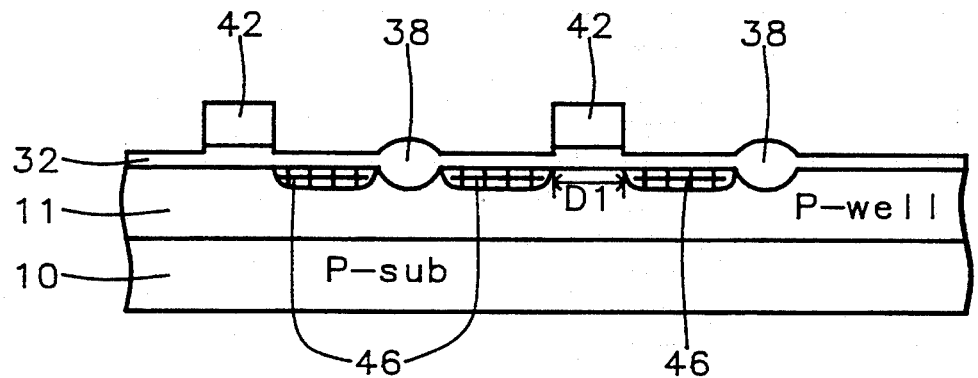

The present invention will be described in detail with reference to the accompanying drawings. It should be noted that the drawings are in greatly simplified form. In practice the memory device structure will be one of many supported on a common substrate connected with suitable metallurgy in various electronic circuit configurations.

Referring now to FIG. 2A, there is shown substrate 10 which shall be a monocrystalline silicon semiconductor body with many devices fabricated therein, as is well known in the art. The substrate 10 is preferable formed of monocrystalline silicon having a surface plane with a crystalline orientation of <1 0 0>. The background substrate dopant is preferably boron with a concentration in the range of 1E14 to 1E16 atoms/cm$^3$. Substrate 10, embodies a background doping of a first type conductivity, preferably P-type. For this illustration, the devices will be formed in a P-well 11 in substrate 10. In an alternative, a conventional twin well process can be used wherein nMOS devices can be formed in the wells. This allows both nMOS and pMOS devices to be formed on the same substrate.

Next, a first insulating layer 32 is formed on the surface of the semiconductor substrate, The thin insulating layer 32 is preferably composed of silicon oxide with a thickness in the range of 50 to 300 angstroms and preferably 200 angstroms. Insulating layer 32 can able grown in a dry oxygen or steam environment at a temperature of approximately 900° C. Insulating layer 32 covers the entire surface of the substrate 10.

After the formation of the first insulating layer 32, an oxidation resistant masking layer 34 is formed overlying layer 32. The oxidation resistant masking layer is preferably formed of silicon nitride with a thickness in the range of 1000 to 3000 angstroms and with a thickness more preferably 1500 angstroms. Layer 34 can be formed of silicon nitride layer by reacting silane and ammonia at atmospheric pressure at 700° to 900° C., or by reacting dichlorosilane and ammonia at reduced pressure (LPCVD) at approximately 700° C. Also, silicon nitride can be formed by plasma enhanced chemical vapor deposition (PECVD) by reacting silane with ammonia or nitrogen in a glow discharge between 200° and 350° C.

Next, using standard photolithographic processes, openings in oxidation resistant layer 34 are formed that define the thick field oxide regions 38. Subsequently, thick field oxide regions 38 are formed in the openings that define the field oxide layer. The field oxide layer 38 has a thickness in the range of 3000 to 7000 angstroms and more preferably a thickness of 5000 angstroms. Field oxide layer 38 can be formed by a conventional atmospheric thermal process where water vapor is reacted with the exposed substrate at a temperature in the range of 700° to 1200° C. In the reaction forming the oxide layer 38, a portion of the underlying silicon is consumed. Typically, for a given silicon oxide thickness, the amount of substrate consumed is approximately one half of the oxide thickness. As illustrated in FIG. 2A, this consumption of the silicon substrate forms a depression in substrate surface 10.

As shown on FIG. 2B, following the field oxide growth, a photoresist layer is patterned and etched to form plurality of elongated spaced parallel line pattern 36 on the oxidation resistant masking layer 34 surface. These resist lines 36 are formed between field oxide regions. Layer 34 is anisotropically etched using resist layer 36 as mask to form a plurality of elongated spaced parallel lines 42 with vertical sidewalls on the thin isolating layer 32. Nitride masking lines 42 have a width in the range of 0.3 to 1.0 microns and a width more preferably 0.5 microns.

At this point an optional threshold voltage implant ($V_t$ implant) can be performed. The Vt implant is used to adjust the threshold voltage of the flash cell. As shown in FIG. 3, the first doped regions 46 are formed by ion implantation off ions of a first conductivity type, with an implant energy in the range of 20 to 150 Kev. and dosage in the range of 1E12 to 1E14 atoms/cm$^2$. The ion implanted to form first doped regions 46 can be boron or BF$_2$ ions. Doped regions 46 have an impurity concentration in the range of 1E16 to 1E18 atoms/cm$^3$. Doped regions 46 have a depth in the range of 0.25 to 0.7 microns.

Figure 4:
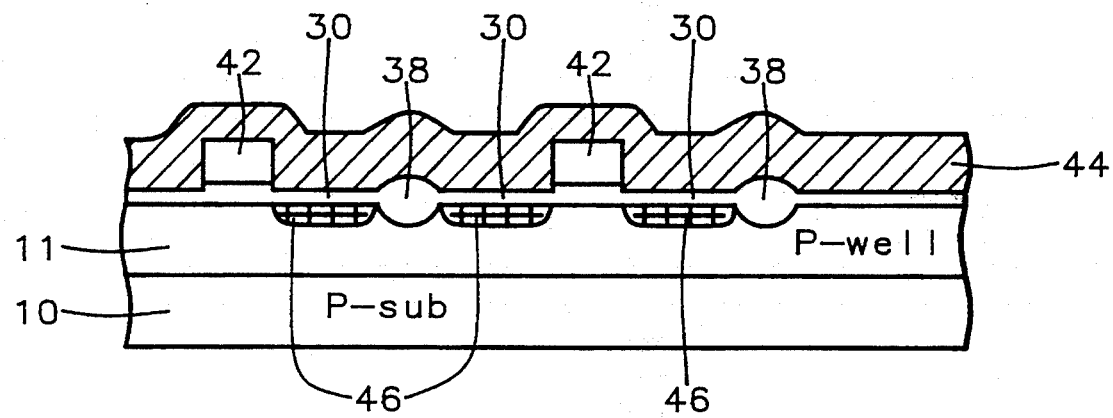

Layer 32 is removed using a conventional etch process. As shown in FIG. 4, a tunnel oxide 30 is grown on the substrate surface. Tunnel oxide 30 can be grown with a dry oxidation process at 800° to 1000° C. For flash EPROM fabrication, layer 30 has a thickness in the range of 60 to 120 angstroms and more preferable a thickness of 100 Angstroms. To make an EPROM, layer 30 has a thickness in the range of 150 to 300 Angstroms.

Figure 5:
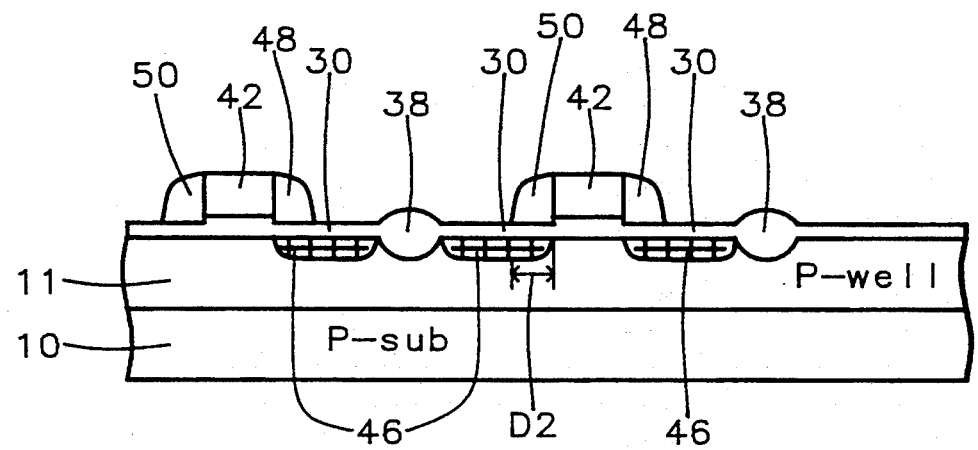

Next, a conformal layer of polycrystalline silicon 44 is formed over the substrate surface. The polycrystalline silicon layer 44 can be deposited by pyrolyzing silane in a low pressure chemical vapor deposition process at approximately 620° C. Polysilicon layer 44 has a thickness in the range of 2000 to 5000 angstroms and preferably a thickness of approximately 4000 angstroms. The thickness of polysilicon layer 44 determines the channel width D2 shown on FIG. 5.

Conformal layer 44 is then anisotropically etched to form dual sidewall floating gates 48, 50. Preferably the conformal polysilicon layer 44 is etched by a commercially available plasma dry etcher with significantly high polysilicon to silicon oxide selectivity and preferably higher than 20 to 1.

Polysilicon floating gates 48,50 have a width in the range of 0.15 to 0.5 angstroms. Also, the thickness of floating gates 48,50 is determined by the thickness of masking lines 42. The shape of the floating gates 48,50 can be controlled by the conformal polysilicon process and the anisotropic etch process. A square shaped floating gate 48,50 can be formed by using a highly conformal polysilicon deposition and a highly anisotropic etch. Polysilicon floating gates 48, 50 can be doped by a conventional phosphorus diffusion using POCl$_3$, an in-situ doping process or by ion implantation, of for example phosphorous ions.

Figure 6:
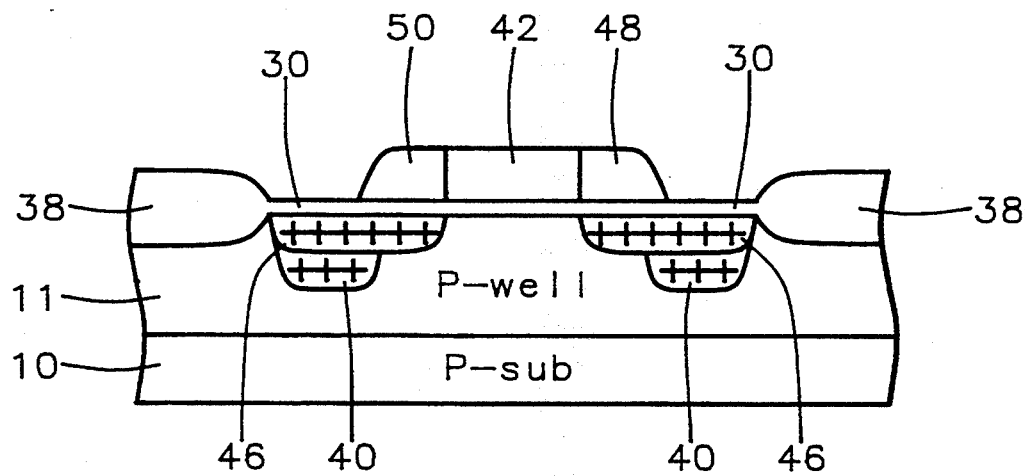

Next, optionally, as shown in FIG. 6, a large angle tilt implanted drain 40 (LATID) can be formed. Next, a P-type ion, boron (B) or BF$_2$ is implanted into the substrate at a large angle tilt from vertical. This implant will form a second doped region 40 which extends under the floating gate 50. Second doped region 40 will improve the punchthrough voltage due to the higher concentration P- region under the floating gates 48, 50.

A large angle tilt implanted drain (LATID) 40 is optionally used to improve punchthrough and to improve program speed if EEPROM or like flash is fabricated. LATID is an optional implant if hot electron programming approach is used, that is if a EEPROM or like flash cell is used. If EEPROM or like flash approach is adopted, that is Fowler-Nordheim tunneling to program, then the LATID formation step may be skipped.

Next, an anisotropic etch with a high nitride to silicon oxide selectivity is used to remove oxidation resistant lines 42.

Figure 7:
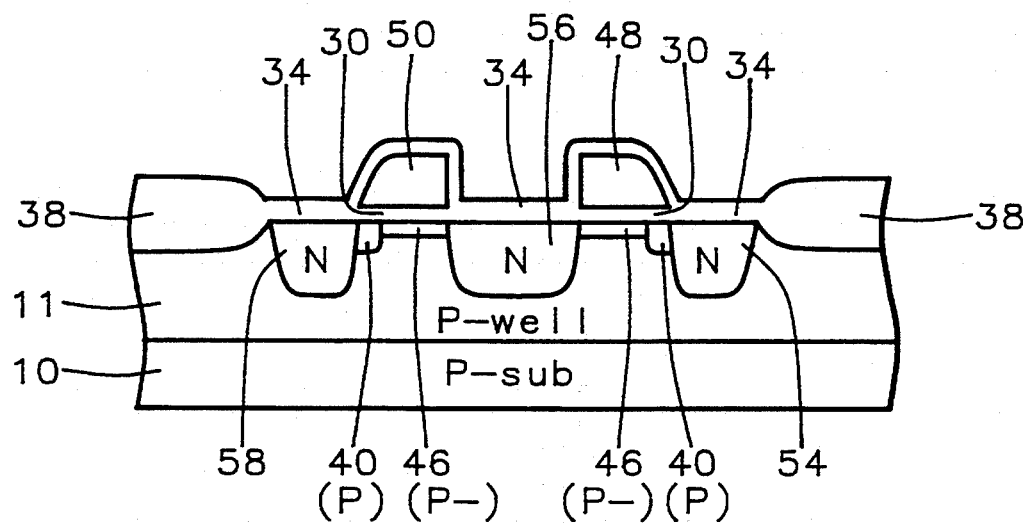
Figure 8:
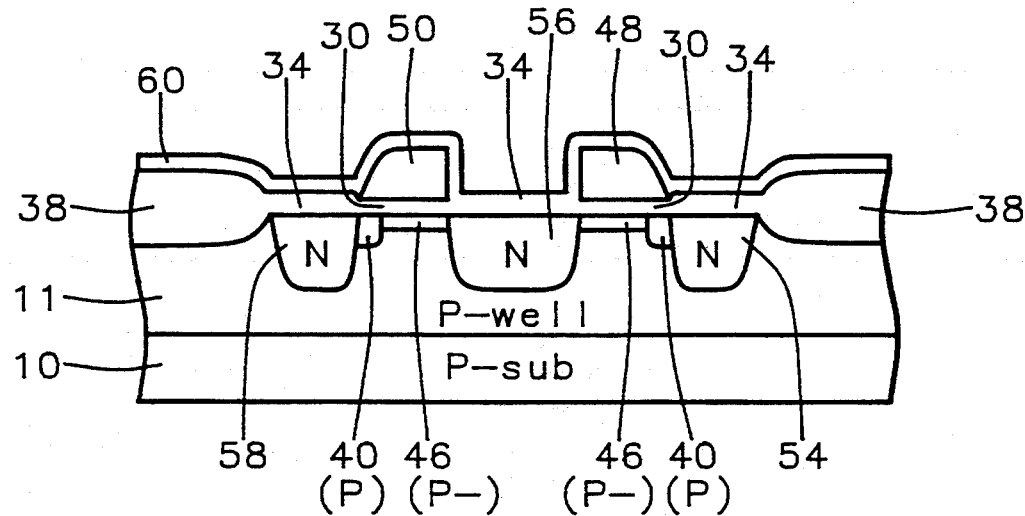

As shown in FIG. 7, ions of a second conductivity type are implanted into the substrate. A photolithography step is needed before this implantation to block areas inside the array which it is not necessary to implant in order to reduce the contact and connection resistance. This step is called the buried N+ (BN+) step. For this implant, the ions are N-type. This forms a source region 56 in-between the floating gate structures. Also drain regions 54, 58 are formed between the floating gates and the field oxide regions. The source 56 and drain 54, 58 regions are formed by ion implantation with an implant energy in the range of 30 to 80 Kev. and dosage in the range of 1E14 to 1E16 atoms/cm$^2$. The ion implanted can be arsenic, phosphorus or antimony ions. The regions 54, 56, 58 have an impurity concentration in the range of 1E19 to 1E21 atoms/cm$^3$.

Subsequently, the substrate is oxidized to thicken tunnel oxide layer 30 forming thick insulating layer 34 and also form an oxide layer on the floating gates 48, 50. Layer 34 should have a resulting thickness in the range of 40 to 150 angstroms.

Next, a second insulating layer is formed over the substrate surface. Layer 60 can be formed of any suitable material, but is preferably a composite layer of silicon oxide, silicon nitride and silicon oxide, which is called ONO. The bottom silicon oxide (SiO$_2$) layer is the previously formed oxide layer 34. The middle nitride layer has a thickness in the range of 100 to 200 angstroms. The nitride layer is form by a conventional low pressure chemical vapor deposition process. The top second oxide layer has a thickness in the range of 40 to 150 angstroms. The second oxide layer is formed by a conventional steam oxidation or a high temperature oxidation performed at a temperature of approximately 790° C. and with a LPCVD process.

Figure 9:
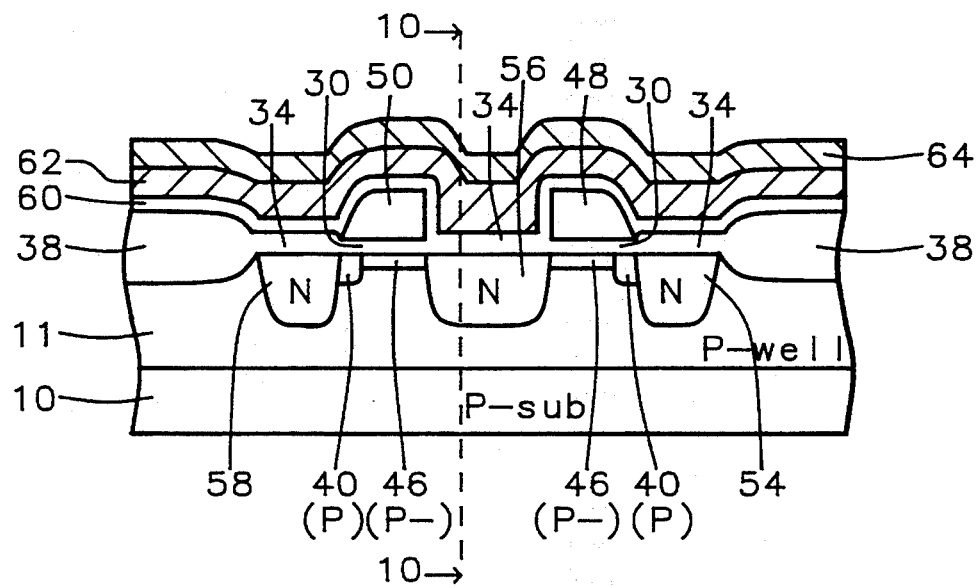

As can be seen in FIG. 9, a second conformal polycrystalline silicon layer 62 is deposited on the substrate surface. Layer 62 can be doped with POCL$_3$. Layer 62 will function as control gates for the device.

Next, a polycide layer 64 is formed over layer 62. Layer 64 will be used to define the word lines. Polycide layer 64 can be formed by applying a refectory metal to polysilicon layer 62, such as chemical vapor depositing (CVD) tungsten silicide, titanium silicide (TiS$_x$), or cobalt silicide.

Figure 10:
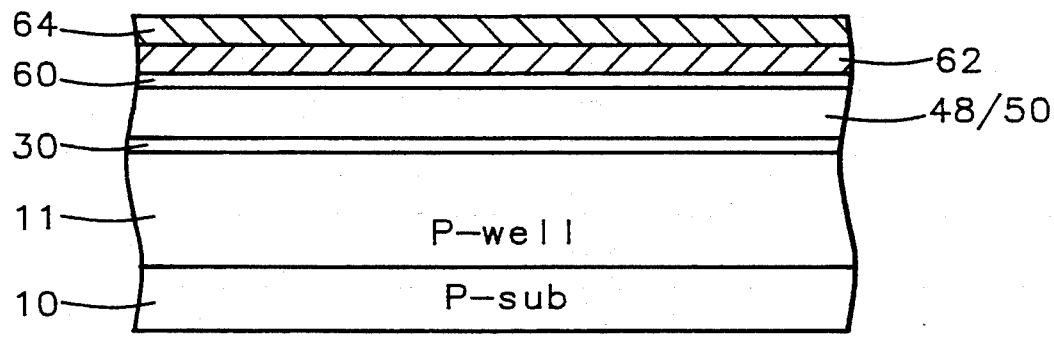
FIGS. 10 and 11 are cross-sectional views taken along axis 10 in FIG. 9.
Figure 11:
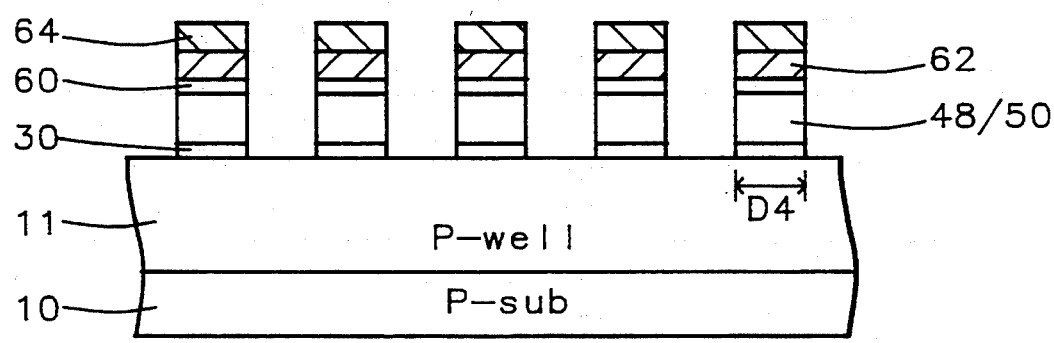

As shown in FIGS. 10 and 11, conventional photolithography processes are used to define wordline patterns in polysilicon and polycide layers 62, 64. FIGS. 10 and 11 are taken along axis 10 in FIG. 9. Referring to FIG. 11, a self-aligned etch is used to etch control gate layer 62, insulating layer 60 and floating gate layers 48, 50 to form wordlines 62, 64 and to define the channel width D4, (shown in FIG. 11) of the cell.

Finally, conventional finishing steps (not shown in FIGS.) are performed, such as applying approximately 5000 to 8000 angstroms of Boron or Phosphorus doped tetraethoxysilane (TEOS) oxide on the substrate. Next, conventional silicon metal contacts can be formed of aluminum and copper alloys. Then conventional metal interconnections can be formed of titanium and tungsten alloys, for example Ti/TiW/W-plug.

This invention allows a smaller cell size than possible using conventional processes which are limited by photolithography limits. The sidewall formation of the floating gates allows cell size to be determined by the thickness of the polysilicon layer 44 which is smaller than the photolithography minimum dimension of the conventional process. Also, the invention uses fully self-aligning processes to form the source 56, drains 54, 58, floating gate 48, 50 and control gates layer 62. These self-aligning processes allow smaller devices to be formed because of the greater precision over non-self-aligned photolithography processes.

While the invention has been particularly shown and described with reference to the preferred embodiments thereof, it will be understood by those skilled in the art that various changes in form and details may be made without departing from the spirit and scope of the invention.

What is claimed is:

1. The method of fabricating an improved erasable programmable read only memory device, having dual sidewall float gates comprising:

forming a thin insulating layer on the surface of a monocrystalline silicon semiconductor substrate having a background impurity of a first conductivity type;

depositing a layer of oxidation resistant material over the thin insulating layer;

patterning the oxidation resistant masking layer to form openings that define field oxide areas on the substrate;

forming thick field oxide regions in the exposed areas in the substrate adjacent to the surface;

depositing, exposing, and developing a resist layer on the substrate surface to cover at least a central area between the field oxide regions;

removing the portions of the oxidation resistant masking layer not covered by the resist layer forming an oxidation resistant masking line with vertical sidewalls;

removing the resist layer;

implanting first conductivity type impurity ions into the substrate using the masking line and the field oxide as masks forming first doped regions for threshold voltage adjustment;

removing the exposed thin insulating layer;

forming a tunnel oxide layer on the substrate surface;

depositing a first conformal polycrystalline silicon layer over the substrate;

anisotropically etching the first conformal polycrystalline silicon layer forming dual floating gates on the vertical sidewalls of the oxidation resistant masking line;

obliquely ion implanting impurity ions of a first conductivity type into said substrate utilizing the dual floating gates, field oxide regions and masking line as masks forming second doped regions in the substrate located on either side of the floating gate structures;

removing the oxidation resistant masking line leaving the dual spaced floating gates;

ion implanting second conductivity type impurity ions into said substrate utilizing the dual floating gates as masks to form a central source region located between the floating gate structures and two spaced drain regions in the substrate located on either side of the floating gate structures;

thickening said tunnel oxide layer forming a thick insulation layer;

forming a composite layer over the surface of the substrate;

depositing a second polycrystalline silicon layer over the composite layer;

forming a polycide layer on top of the second polycrystalline silicon layer;

etching the polycide layer, the second polycide layer, the composite layer and the floating gates to form wordlines in the second polycrystalline silicon and polycide layers;

and forming electrical contacts and metallurgy lines with appropriate passivation, and connecting the source, drain and gate elements to form an erasable programmable memory device.

2. The method of claim 1 wherein the substrate has a background impurity of a first conductivity type and a well with a background impurity of a second opposite type:

fabricating a first field effect transistor in the substrate of a first conductivity type having source and drain regions with an impurity of a second conductivity type;

forming a gate between the source and drain regions of the first field effect transistor;

forming a second field effect transistor in the well of a second conductivity type having source and drain regions of a first conductivity type;

and forming a gate between the source and drain regions of the second field effect transistor.

3. The method of claim 1 wherein the first conductivity type impurity is P-type and the second conductivity type impurity is N-type.

4. The method of claim 1 wherein the substrate has a well having a background impurity of a first conductivity type.

5. The method of claim 1 wherein the masking line is formed of silicon nitride.

6. The method of claim 1 wherein the floating gates have a width in the range of 0.15 to 0.5 microns.

7. The method of claim 1 wherein the source and drain regions have a dopant concentration in the range of 1E19 to 1E21 atoms/cm$^3$.

8. The method of claim 1 wherein the thin insulating layer under the floating gates has a thickness in the range of 60 to 300 angstroms.

9. The method of claim 1 wherein the first doped regions for threshold voltage adjustment have a dopant concentration in the range of 1E16 to 1E18 atoms/cm$^3$.

10. The method of claim 1 wherein the ion implantation forming the first doped regions uses boron or BF$_2$ ions with an implant dosage in the range of 1E12 to 1E14 atoms/cm$^2$ and an implant energy in the range of 20 to 150 Kev.

11. The method of claim 1 wherein the composite layer is formed of sandwich structure of silicon oxide, silicon nitride and silicon oxide.

12. The method of fabricating an improved erasable programmable read only memory device, having a dual sidewall floating gate on a semiconductor substrate comprising the steps of:

forming a thin insulating layer on the surface of a semiconductor substrate having a background doping of a first conductivity type;

forming field oxide regions in the substrate;

forming a masking line with vertical sidewalls in between the field oxide regions;

removing the exposed thin insulating layer;

forming a tunnel oxide layer on the substrate surface;

forming dual floating gates on the vertical sidewalls of said masking line;

removing the masking line leaving the dual spaced floating gates;

ion implanting impurity ions of a second conductivity type into said substrate utilizing the dual floating gates as masks to form a central source region located between the floating gate structures and two spaced drain regions in the substrate located on either side of the floating gate structures;

thickening said tunnel oxide layer forming a thick insulation layer;

depositing a composite layer over the surface of the substrate over the dual floating gate;

forming wordlines, electrical contacts and metallurgy lines with appropriate passivation, and connecting the source, drain and gate elements to forms an erasable programmable memory device.

13. The method of claim 12 wherein first doped regions of a first conductivity type are formed, after the masking line is formed, in the substrate between the field oxide regions and the masking line.

14. The method of claim 12 wherein second doped regions of a first conductivity type are formed, after the dual floating gates are formed, in the substrate by obliquely ion implanting ions of a first conductivity type into said substrate utilizing the dual floating gate, the field oxide regions and the masking line as masks forming second doped regions in the substrate located on either side of the floating gate structures.

15. The method of claim 12 wherein the substrate having a background impurity of a first conductivity type has formed therein a well embodying impurity ions of a second conductivity type;

fabricating a first field effect transistor in the substrate having source and drain regions of a second conductivity type;

forming a gate between the source and drain regions of the first field effect transistor;

forming a second field effect transistor in the well having source and drain regions of a first conductivity type;

and forming a gate between the source and drain regions of the second field effect transistor.

16. The method of claim 12 wherein the first conductivity type impurity is P-type and the second conductivity type impurity is N-type.

17. The method of claim 12 wherein the substrate has a well having a background impurity of a first conductivity type.

18. The method of claim 12 wherein the floating gates have a width in the range of 0.15 to 0.5 microns.

19. The method of claim 12 wherein the thin insulating layer under the floating gates has a thickness in the range of 60 to 300 angstroms.

20. The method of claim 12 wherein the first doped regions for threshold voltage adjustment have a dopant concentration in the range of 1E16 to 1E18 atoms/cm$^3$.

21. The method of claim 12 wherein the ion implantation forming the first doped regions uses boron or BF$_2$ ions with an implant dosage in the range of 1E12 to 1E14 atoms/cm$^2$ and an implant energy in the range of 20 to 150 Kev.

22. The method of claim 12 wherein the source and drain regions have a concentration in the range of 1E19 to 1E21 atoms/cm$^3$.

23. The method of claim 12 wherein the composite layer is formed with a sandwich structure of silicon oxide, silicon nitride and silicon oxide.

* * * * *